US012641917B2

(12) United States Patent
Faccinelli et al.

(10) Patent No.: US 12,641,917 B2
(45) Date of Patent: May 26, 2026

(54) SENSOR MODULE

(71) Applicant: ams International AG, Jona (CH)

(72) Inventors: Martin Faccinelli, Graz (AT); Harald Etschmaier, Graz (AT); Gerhard Peharz, Gleisdorf (AT); Fabian Huber, Graz (AT)

(73) Assignee: AMS INTERNATIONAL AG, Jona (CH)

( * ) Notice: Subject to any disclaimer, the term of this patent is extended or adjusted under 35 U.S.C. 154(b) by 516 days.

(21) Appl. No.: 18/041,466

(22) PCT Filed: Aug. 3, 2021

(86) PCT No.: PCT/EP2021/071628
§ 371 (c)(1),
(2) Date: Feb. 13, 2023

(87) PCT Pub. No.: WO2022/033920
PCT Pub. Date: Feb. 17, 2022

(65) Prior Publication Data
US 2023/0299215 A1     Sep. 21, 2023

(30) Foreign Application Priority Data

Aug. 14, 2020    (GB) ...................................... 2012743
Dec. 11, 2020    (GB) ...................................... 2019579

(51) Int. Cl.
H10F 77/50     (2025.01)
G02B 1/04     (2006.01)
H10F 71/00     (2025.01)
H10F 77/30     (2025.01)

(52) U.S. Cl.
CPC ............. H10F 77/50 (2025.01); G02B 1/041 (2013.01); H10F 71/136 (2025.01); H10F 77/331 (2025.01)

(58) Field of Classification Search
CPC ...... H10F 77/50; H10F 77/331; H10F 77/407; H10F 71/00; G02B 1/041
See application file for complete search history.

(56) References Cited

U.S. PATENT DOCUMENTS

| | | | |
|---|---|---|---|
| 8,313,971 B2 | 11/2012 | Fujii et al. | |
| 2010/0118182 A1* | 5/2010 | Fujii ...................... | H04N 23/57 |
| | | | 348/374 |
| 2012/0141143 A1* | 6/2012 | Hayashi ................. | G02B 6/423 |
| | | | 398/201 |

(Continued)

OTHER PUBLICATIONS

Voignier, Vincent (EP Authorized Officer), International Search Report and Written Opinion in corresponding International Application No. PCT/EP2021/071628 mailed on Nov. 10, 2021, 11 pages.

*Primary Examiner* — Fernando L Toledo
*Assistant Examiner* — Marshall Mu-Nuo Hatfield
(74) *Attorney, Agent, or Firm* — MH2 Technology Law Group LLP

(57) ABSTRACT

A sensor module including a sensor and a transparent body which is provided over the sensor, wherein the transparent body comprises a base portion and a convex lens which extends outwardly from the base portion and is located above the sensor, wherein an opaque material is provided on the base portion and surrounds the convex lens.

14 Claims, 4 Drawing Sheets

(56) References Cited

U.S. PATENT DOCUMENTS

| | | | |
|---|---|---|---|
| 2013/0003199 A1* | 1/2013 | Jeong ............... | B29D 11/00375 |
| | | | 264/1.7 |
| 2014/0264691 A1* | 9/2014 | Oganesian ............ | H10F 39/811 |
| | | | 257/432 |
| 2017/0294560 A1* | 10/2017 | Ho ........................ | H10H 20/855 |
| 2018/0190858 A1* | 7/2018 | Lin ........................ | H10F 55/255 |
| 2020/0209679 A1* | 7/2020 | Ling ................. | G06V 40/1365 |

* cited by examiner

SENSOR MODULE

CROSS-REFERENCE TO RELATED APPLICATIONS

The present application is the national stage entry of International Patent Application No. PCT/EP2021/071628, filed on Aug. 3, 2021, and published as WO 2022/033920 A1 on Feb. 17, 2022, which claims the benefit of priority of Great Britain Patent Application Nos. 2012743.7, filed on Aug. 14, 2020, and 2019579.8, filed Dec. 11, 2020, all of which are incorporated by reference herein in their entireties.

TECHNICAL FIELD OF THE DISCLOSURE

The disclosure relates to a sensor module. The sensor module may form part of a smartphone, tablet or some other device.

BACKGROUND OF THE DISCLOSURE

Sensor modules are used for example in smartphones, tablets or other devices. A typical sensor module comprises a sensor and associated electronics provided on a substrate (e.g. a PCB). A transparent body is provided over the sensor in order to protect it from the environment. A lens is formed in the transparent body, the lens being a convex lens which is configured to receive light and focus the light onto the sensor. A typical sensor module further comprises a cover formed from an opaque material which is provided over the transparent body and is fixed to the substrate. The cover includes an opening which is located over the convex lens of the transparent body. The cover is intended to ensure that only light which passes through the lens is incident upon the sensor.

In a typical manufacturing process an array of sensing modules is manufactured together on a substrate. For example, an array of more than 100 sensing modules may be manufactured on a single substrate. Typically, the covers which are fitted to the sensor modules are provided as a single piece which is fitted onto the single substrate. The single piece includes an opening for each sensor module lens. Because the openings are provided as an array in a single piece, and due to manufacturing tolerances when making the covers and the sensor modules, it is not possible to ensure that all of the openings align perfectly with the lenses of the sensor modules. It is therefore necessary to make the openings a bit wider than the lenses, in order to ensure that all of the openings fit over their respective lenses. In other words, the diameter of the openings is greater than the diameter of the lenses in order to accommodate manufacturing tolerances.

The diameters of the openings being greater than the diameters of the lenses is problematic because this allows light to pass into the sensor modules and onto the sensors without travelling through the lenses. This reduces the accuracy of the sensors. It may for example generate so called "ghost targets" which are seen by the sensors. In general, the signal to noise ratio provided by the sensors is reduced.

It is an object of the present disclosure to address the above problem.

SUMMARY

In general, this disclosure proposes to overcome the above problem by providing an opaque material on a base portion of a transparent body which surrounds a lens. The opaque material may be provided as a liquid which is then cured to become a solid. The liquid may flow inwardly to form a meniscus against the lens. The liquid may be provided in a recess which is provided around the lens. Because the recess surrounds the convex lens, and the opaque material is provided in the recess, the opaque material automatically aligns with the convex lens. The opaque material may prevent light from passing adjacent to the convex lens and onto the sensor. In other words, the opaque material may together substantially prevent light from being incident upon the sensor unless that light has passed through the convex lens. This provides improved performance of the sensor.

According to a first aspect of the present disclosure there is provided a sensor module comprising a sensor and a transparent body which is provided over the sensor, wherein the transparent body comprises a base portion and a convex lens which extends outwardly from the base portion and is located above the sensor, wherein an opaque material is provided on the base portion and surrounds the convex lens.

Advantageously, the opaque material forms an aperture that surrounds the convex lens and is automatically aligned with the convex lens.

The opaque material may be in contact with the convex lens.

The opaque material may be in contact with a bottom portion of the convex lens.

The base portion of the transparent body may have a substantially flat upper surface.

The opaque material may be provided in a recess in the transparent body, the recess surrounding the convex lens.

An inner edge of the recess may correspond with an outer edge of the convex lens.

The recess may be generally circular.

The recess may include one or more outwardly extending arms.

The recess may have a depth of at least 50 microns.

The opaque material may be formed from a material that was liquid and that has been cured to become solid.

The opaque material may be a polymer.

The polymer may be opaque at near infrared wavelengths.

The polymer may be curable using light.

The transparent body may be transfer moulded or compression moulded.

The sensor module may further comprise a substrate which supports the transparent body. The sensor module may further comprise a cover which is supported by the substrate. The cover may include an opening through which the convex lens projects.

The opaque material and the cover together may substantially prevent light from being incident upon the sensor unless that light has passed through the convex lens.

According to a second aspect of the invention there is provided a method of making a sensor module, the method comprising providing a transparent body over a sensor, the transparent body comprising a convex lens extending from a base portion, delivering liquid to the base portion such that the liquid surrounds the convex lens, and curing the liquid in order to convert the liquid into an opaque solid.

The liquid may be opaque.

A recess which surrounds the convex lens may be formed in the base portion. The liquid may flow in the recess to surround the convex lens.

The liquid may be delivered to an outwardly extending arm of the recess.

The liquid may have a viscosity of less than 500 Pas.

The liquid may be delivered around the convex lens and adjacent to the convex lens, so that the liquid surrounds the convex lens.

The liquid may have a viscosity of at least 200 Pas.

The liquid may move inwardly and form a meniscus against the convex lens.

The liquid may be delivered from a nozzle. The nozzle may form part of an inkjet head.

The sensor module may be one of a plurality of sensor modules provided in an array.

The method may further comprise providing the sensor modules of the array with covers, the covers being provided as a single piece which is fitted to the array of sensor modules such that the convex lenses of the sensor modules project through openings in the covers.

The method may further comprise dicing the array of sensor modules to form individual sensor modules.

Finally, the sensor module disclosed here utilises a novel approach at least in that a lens of the sensor module is surrounded by opaque material provided as a liquid which is cured to form a solid.

BRIEF DESCRIPTION OF THE PREFERRED EMBODIMENTS

Some embodiments of the disclosure will now be described by way of example only and with reference to the accompanying drawings, in which.

Figure 4:
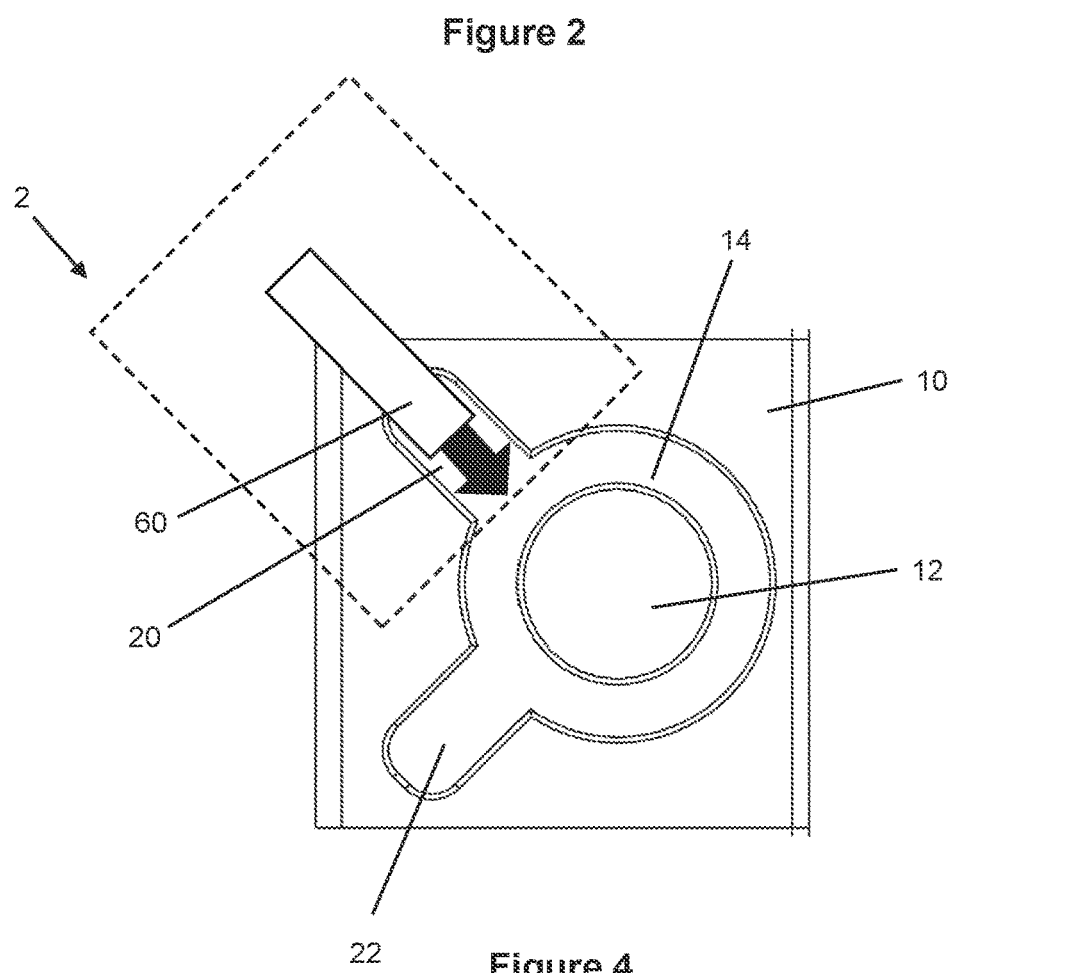
Figure 5:
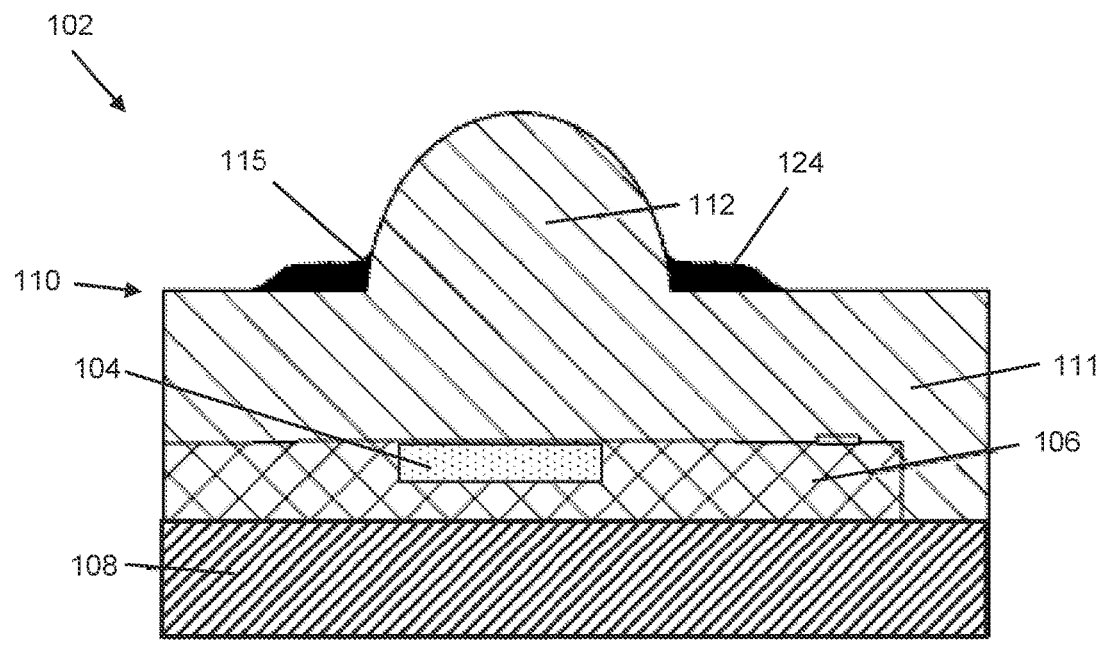
Figure 6:
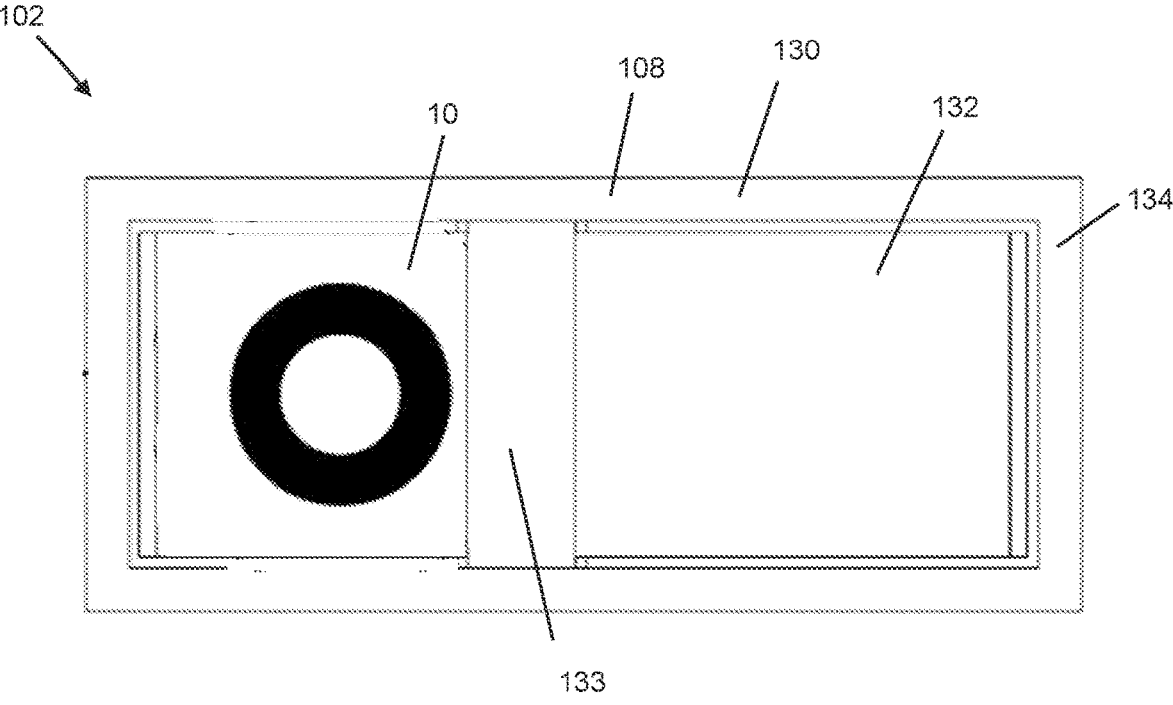

FIG. 4 schematically depicts part of a method of producing the sensor module;

FIG. 5 depicts in cross section part of a sensor module according to an alternative embodiment of the invention; and FIG. 6 depicts the sensor module of FIG. 5 viewed from above, without a cover being provided on the sensor module.

DETAILED DESCRIPTION OF THE PREFERRED EMBODIMENTS

Generally speaking, the disclosure provides a sensor module with a transparent body having with a convex lens, and with an opaque material being provided around the convex lens.

Some examples of the solution are given in the accompanying figures.

Figure 1A:
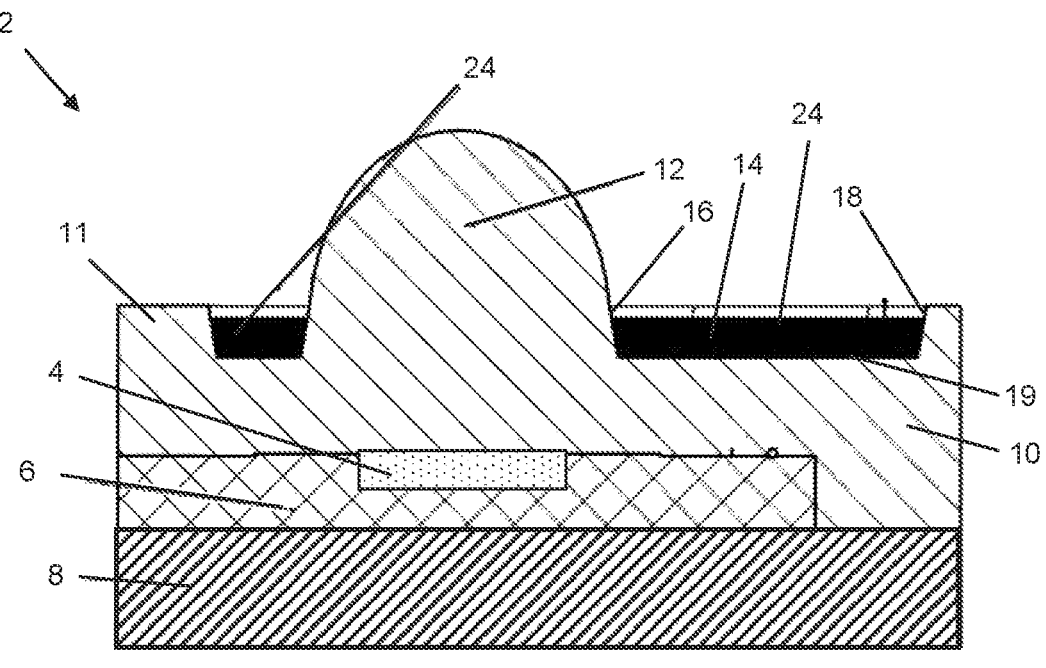
FIG. 1A depicts in cross section part of a sensor module according to an embodiment of the invention.
Figure 1B:
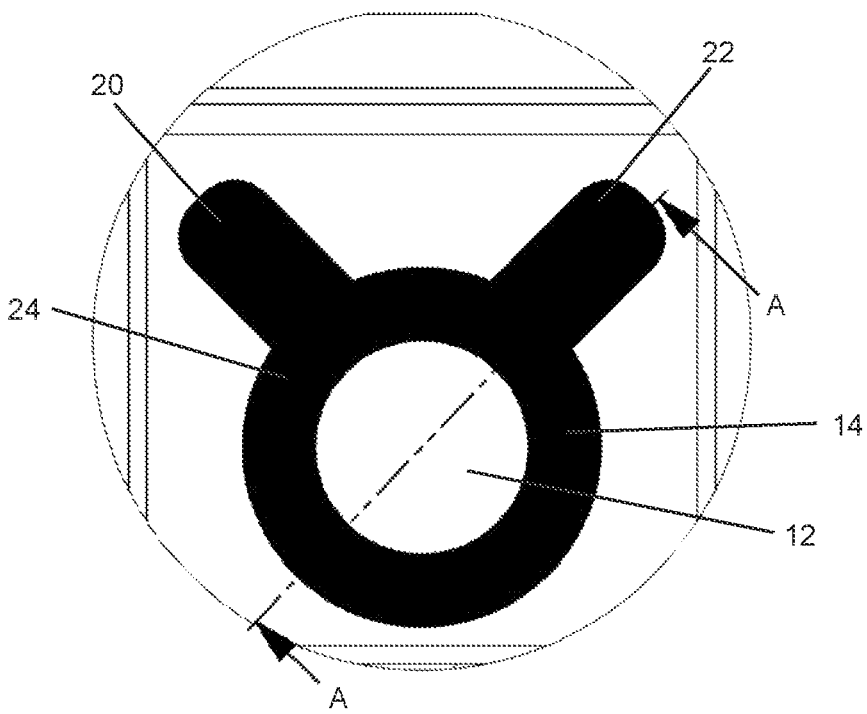
FIG. 1B depicts part of the sensor module viewed from above.

FIG. 1A depicts in cross-section part of a sensing module according to an embodiment of the invention. FIG. 1B depicts part of the same sensing module viewed from above. A line A-A shows the cross-section which is depicted in FIG. 1A.

The sensor module 2 comprises a sensor 4 and associated electronics 6. The sensor 4 and electronics 6 may be in the form of an application specific integrated circuit (ASIC). The sensor and the electronics are supported by a substrate 8, which may for example be a printed circuit board (PCB). Electrical connection between the electronics 6 and the substrate 8 may for example be provided by solder and/or wires (not depicted). Other elements such as a solder mask, copper layers, etc. may be present but are omitted here as they are not relevant to the invention.

A transparent body 10 is provided over the sensor 4 and at least some of the electronics 6. The transparent body 10 may be formed for example from a polymer such as resin or plastic. The transparent body may for example be formed by positioning a mold over the sensor 4 and electronics 6, filling the mold with epoxy resin or some other transparent liquid, and then curing the liquid. Curing may for example be performed using UV light. Once the material has been cured, and has therefore solidified, the mold is removed. One or more edges of the transparent body 10 may contact the substrate 8.

Referring to FIGS. 1A and 1B in combination, it may be seen that the transparent body 10 comprises a base portion 11 and a convex lens 12 which extends from the base portion. The convex lens 12 is located above the sensor 4 (for brevity this may be referred to as lens 12). A recess 14 formed in the transparent body 10 (in the base portion 11 surrounds the convex lens 12. The recess 14 abuts a bottom end of the lens 12. The lens 12 is circular when viewed from above, and consequently the recess 14 has an inner edge 16 which is also circular when viewed from above. In general, the inner edge 16 of the recess 14 corresponds with an outer edge of the lens 12. In other words an inner edge 16 of the recess 14 forms a bottom portion of the lens 12. A slope of the inner edge 16 is a continuation of the shape of the convex lens 12. The inner edge 16 is angled outwards. This advantageously allows the recess 14 to be made in the transparent body 10 when forming the transparent body using a moulding process (the slope allows the transparent body to be released easily from the mould).

The recess 14 has an outer edge 18. The outer edge 18 may be generally circular (as depicted), and thus the recess 14 may be generally circular. However, in other embodiments the outer edge 18 of the recess 14 may have some other shape. The outer edge 18 is angled outwards. This advantageously allows for easy release of the transparent body 10 from a mould.

The recess has a flat bottom surface 19. In other arrangements the recess may have a differently shaped bottom surface (e.g. a concave bottom surface). A flat bottom surface may be easiest to form in a mould using conventional tooling. However, other shaped bottom surfaces may be used. The shape of the bottom of the recess is not important, provided that the layer formed in the recess is opaque at wavelengths of interest.

The recess may for example have a depth of around 100 microns. For example, the recess may have a depth of at least 50 microns. If the recess had a depth of less than 50 microns then there might not be sufficient thickness of an opaque material to prevent some transmission of light through the opaque material provided in the recess. A maximum depth of the recess may be determined by the height of wirebonds (not depicted) which connect to the sensor 4 (the recess should not expose the wirebonds).

The recess 14 includes first and second arms 20, 22 which project outwardly from the rest of the recess (which may be generally circular). As is explained further below, these arms 20, 22 allow for easy delivery of opaque liquid into the recess 14. However, in some embodiments the arms may be omitted.

An opaque material 24 is provided in the recess 14. As is explained further below, the opaque material 24 is delivered as a liquid into the recess 14. The liquid flows around the recess such that the liquid surrounds the lens 12. The opaque material then solidifies, e.g. due to curing, and forms a solid opaque layer in the recess 14. The opaque material 24 prevents light from passing through parts of the transparent body 10 which surround the lens 12 and then being incident upon the sensor 4. In other words, the opaque material 24 in the recess 14 (in combination with a cover) substantially prevents light from being incident upon the sensor 4 unless that light has passed through the lens 12. This advantageously improves the signal to noise ratio provided by the sensor 4. It may improve the performance of the sensor 4 in bright conditions and/or may improve the sensing range of the sensor.

In one embodiment the sensor module 2 is a proximity sensor module which is configured to determine the distance from the sensor 4 to an object. An emitter (see FIG. 2) emits light, e.g. infrared light, and the sensor 4 detects light which is reflected from objects in the vicinity of the sensor module 2. Embodiments of the invention may increase the accuracy of the measurements provided by the proximity sensor module. For example, ambient light incident upon the sensor 4 may be reduced, thereby providing an improvement of the signal to noise ratio. This in turn may increase the range over which the sensor provides an accurate measurement of distance.

Another advantage provided by the disclosure is that the size of the lens may be reduced. If the disclosure were not used, then in order to prevent light from bypassing the lens and being incident upon the sensor a larger lens could be used. However, this would have a longer focal length and provide lower efficiency. Embodiments of the disclosure allow a smaller lens with higher efficiency to be used.

In another embodiment the sensor 4 may be an ambient light sensor. Ambient light sensors may be used to determine the level of ambient light, in order to determine the intensity with which to emit light from a display screen of a smartphone, tablet or other device. In such a case, the convex lens 12 captures ambient light over a range of angles and directs that light onto the sensor 4. Embodiments of the invention advantageously ensure that only light which has passed through the convex lens 12 is incident upon the sensor 4. This avoids light from a light source passing directly through the transparent body 10 without passing through the lens 12 and introducing an inaccuracy into the output from the ambient light sensor (such light would have a disproportionate effect on the measured level of ambient light).

Figure 2:
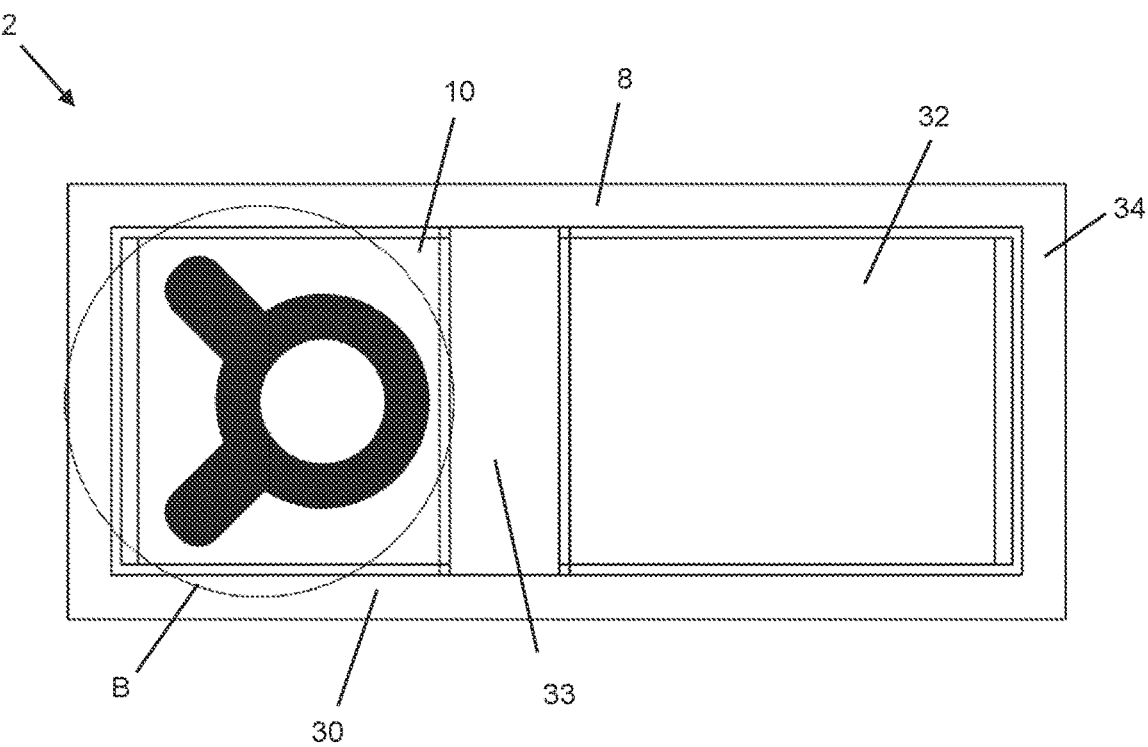
FIG. 2 depicts the sensor module viewed from above, without a cover being provided on the sensor module.

FIG. 2 depicts the entire sensor module 2 viewed from above. The portion of the sensor module shown in FIG. 1 is encircled by circle B. As may be seen, the substrate 8 is generally rectangular in shape, and the transparent body 10 covers only part of it. Edges of the transparent body 10 do not reach the edge of the substrate 8. As a result there is a border 30 which extends around the perimeter of the transparent body 10.

A second transparent body 32 is located adjacent to transparent body 10 (which may be referred to as the first transparent body 10). The second transparent body 32 may for example cover an emitter (not depicted) such as a vertical cavity surface emitting laser (VCSEL) or a light emitting diode (LED). Again, a border 34 of the substrate 8 extends around the second transparent body 32. The borders 30, 34 meet between the first transparent body 10 and the second transparent body 32 to form a combined border 33.

Figure 3A:
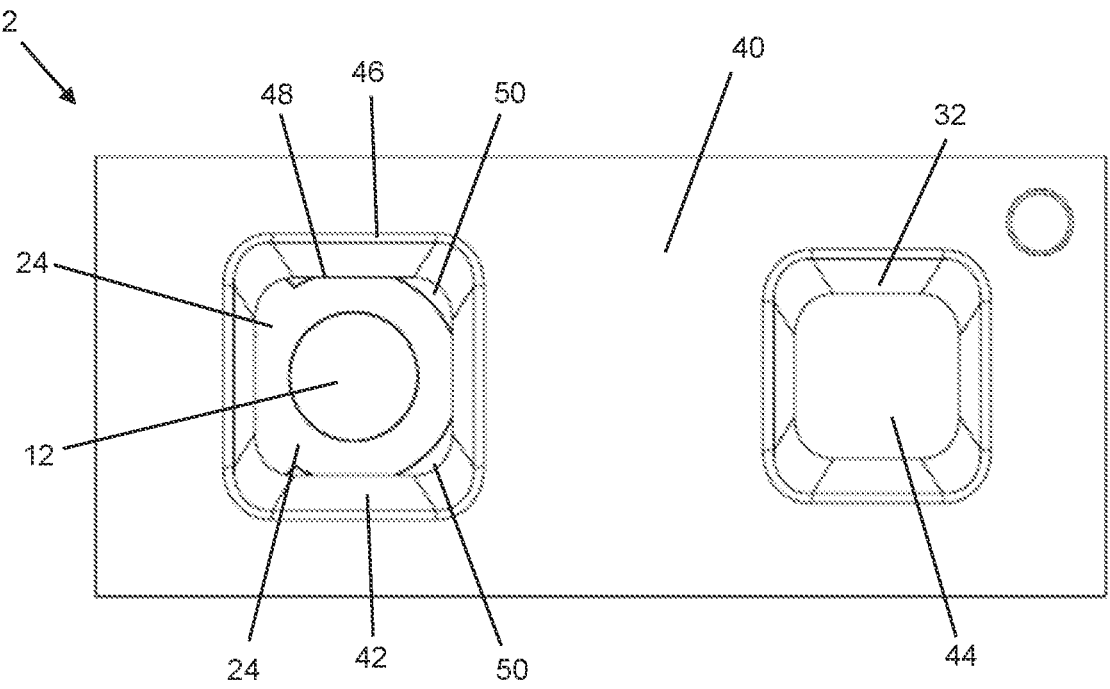
FIG. 3 depicts the sensor module, including a cover, viewed from above and viewed in cross-section from one side.
Figure 3B:
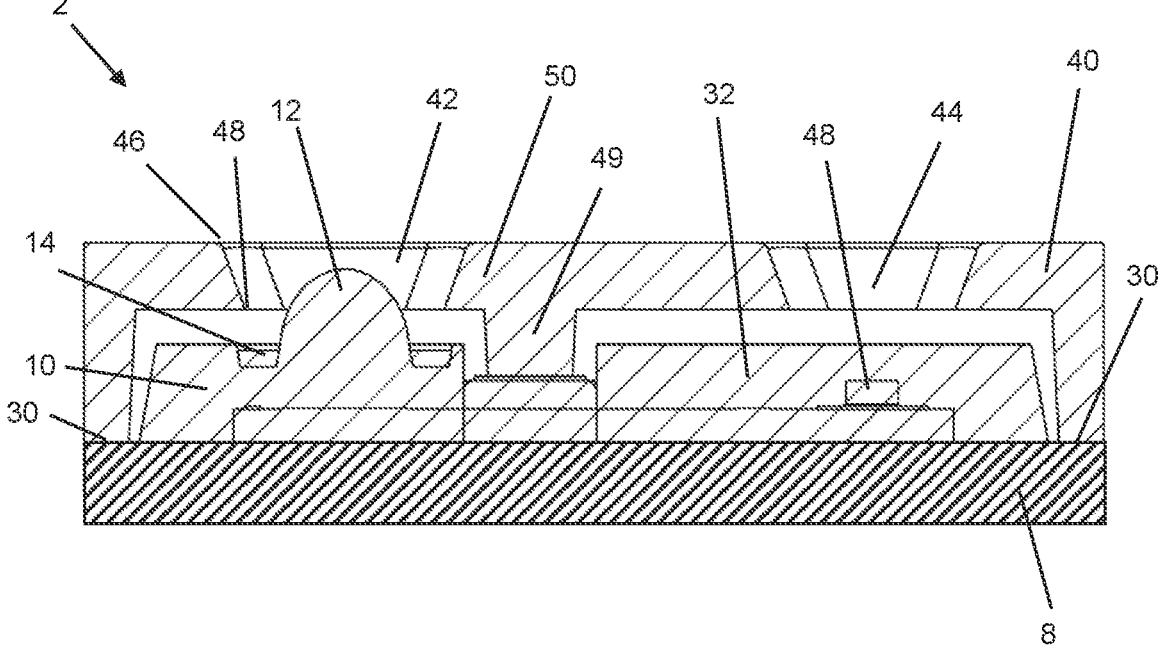

FIG. 3A depicts the sensor module 2 viewed from above, now including a cover 40 placed over the first and second transparent bodies 10, 32. FIG. 3B depicts the sensor module 2 and cover 40 in cross section viewed from one side. The recess 14 is depicted in FIGS. 3A and 3B without the opaque material being present in order to allow recess features to be more easily seen. In practice, the opaque material will be present before the cover 40 is fitted. Sides of the cover 40 extend over sides of the transparent body and contact the substrate 8 at the borders 30, 34. The cover 40 may be fixed to the substrate 8. The cover is formed from opaque material (e.g. a polymer such as plastic, resin or liquid crystal polymer) and includes a first opening 42 and a second opening 44. The first opening 42 is located over the lens 12. The second opening 44 is located over an emitter 48.

The cover 40 includes a central portion 49 which extends between the first transparent body 10 and the second transparent body 32. The central portion 49 of the cover 40 prevents light from travelling directly from the emitter 48 to the sensor 4.

Since the cover 40 is formed from opaque material, light cannot pass through the cover and be incident upon the sensor 4 of the sensor module. Only light which passes through the first opening 42 can be incident upon the sensor 4. As may be seen, the first opening 42 is significantly larger than the lens 12. This advantageously provides some tolerance in the positioning of the cover 40 such that the cover 40 may still be fitted to the sensor module 2 even if there is some misalignment of the cover with respect to the first transparent body 10.

The first opening 42 tapers inwardly from an outer edge 46 to an inner edge 48. The perimeter of the inner edge 48 determines the area over which light is incident upon the lens 12 and other parts of the transparent body 10. As may be seen, the recess 14 (which in practice is filled with opaque material) fills almost all of the area of the first opening 42 which is radially outwards of the lens 12. Thus, the opaque material prevents light which would otherwise have passed through the transparent body 10 onto the sensor 4 from doing so. As explained further above, this improves the performance of the sensor.

As may be seen in FIG. 3A, there are small areas 50 which are outside of the perimeter of the opaque material 24 but which are visible through the first opening 42. These areas 50 are sufficiently far from an outer edge of the sensor 4 that light which enters the transparent body 10 through the areas is not incident upon the sensor. In some instances a small amount of light may pass through such an area 50 and be incident upon the sensor 4. However, the intensity of the light is sufficiently low that it does not have a significant effect upon the output from the sensor 4.

FIG. 4 schematically depicts providing opaque liquid into the recess 14 of the first transparent body 10. As may be seen in FIG. 4, a nozzle 60 is positioned at a distal end of the first arm 20 of the recess 14. Opaque liquid is delivered from the nozzle 60 into the first arm 20 of the recess 14. The delivered liquid flows around the portion of the recess 14 which encircles the lens 12 and flows into the second arm 22. The nozzle 60 forms part of an inkjet head 62, and is located at a lowermost surface of the inkjet head. The inkjet head 62 is shown as an empty box delineated by a dashed line, so that the nozzle 60 and elements below the inkjet head may be seen. Although the opaque liquid is delivered to the first arm 20 in FIG. 4, it could be delivered to the second arm 22.

The opaque liquid may be any curable opaque liquid, for example epoxy resin containing carbon black (or some other liquid containing carbon black). Any monomer which can be cured to form a polymer in a non-reversible manner may be used. The curing may for example be performed using ultraviolet radiation. An advantage of doing this is that the curing is achieved very quickly (e.g. in less than 10 seconds). An alternative method of curing uses heat, but this may take more time (e.g. typically an hour or more). Curing using heat could in some instances cause damage to the sensor or to the electronics of the sensor module. The opaque liquid may be referred to as curable ink.

The first transparent body 10 may be formed using transfer moulding. Transfer moulding is most effective when it is being used to form a symmetrical shape. This is one reason why the recess 14 is provided with two arms 20, 22 even though only one of the arms receives the opaque liquid. In other embodiments, a single arm may be provided. More than two arms may be provided (and even number of arms may be provided). Other methods such as compression moulding may be used to form the transparent body 10. Injection moulding may be used.

The second transparent body 32 may also be formed using injection moulding. The first and second bodies 10, 32 may be formed using the same process. They may be formed as separate bodies, or may be formed as a single body which is then separated into two (e.g. using a sawing process).

Several advantages arise from delivering the opaque liquid at an arm 20 (or 22) of the recess 14. If the arms 20, 22 were not present and opaque liquid was instead delivered directly into a part of the recess located next to the lens 12, then higher accuracy positioning may be required when injecting the liquid. This is to minimise the risk of liquid accidentally being injected onto the lens. This would cause a dark area on the lens and would negatively affect the performance of the sensor 4. Another advantage of delivering via an arm 20 (or 22) is that the opaque liquid flows smoothly around the lens 12 without significant asymmetric flow occurring. Asymmetric flow could occur if the opaque liquid was injected directly adjacent to the lens. Avoiding asymmetric flow may help to avoid bubbles being formed in the opaque liquid. The presence of a second arm may be beneficial for delivery of the opaque liquid because it may act as a spill-over reservoir.

As depicted, the nozzle 60 is part of an inkjet head 62. A further advantage provided by the arms 20, 22 is that it is easier to move the inkjet head to the end of an arm 20 (or 22) than it is to move the inkjet head to a position closer to the lens 12. This is particularly the case if the nozzle of the inkjet head is not provided at one end of the housing of the inkjet head (e.g. as depicted), because in such an arrangement the housing of the inkjet head may collide with the lens 12 before the nozzle 60 is in a desired position above the part of the recess 14 that encircles the lens. In addition, moving the inkjet head 62 to the end of an arm 20 (or 22) requires a smaller movement than moving to a position closer to the lens 12. This smaller movement may allow faster operation of the inkjet head 62 (or more generally faster operation of the nozzle).

A single inkjet head 62 may be used to fill a single recess 14. In an embodiment multiple inkjet heads may be used to fill multiple recesses (for separate sensors) all held on the same substrate in parallel. This may increase production speed.

The viscosity of the opaque liquid is selected to be sufficiently low that it will flow fully around the lens 12. This avoids the need for example for the nozzle to deliver the opaque liquid directly to all locations at which the opaque liquid is required (which would be the case if a higher viscosity liquid that didn't flow was used). This is advantageous because requiring the nozzle to circumnavigate the lens would be difficult to achieve and would also be time consuming. The viscosity of the opaque liquid may for example be 4 Pas. A viscosity of 3 Pas or more may be needed in order to allow conventional tooling to be used. A higher viscosity may be used (e.g. up to 500 Pas), but the higher the viscosity the longer it will take for the opaque liquid to surround the lens 12, thereby reducing production throughput.

An alternative embodiment of the disclosure is depicted in FIGS. 5 and 6. Many features of this embodiment correspond with the embodiment described above and depicted in FIGS. 1 to 4. Given this, those features may not be fully described in connection with this embodiment. In this embodiment a sensor module 102 comprises a sensor 104 and associated electronics 106 (which may be an ASIC), supported by a substrate 108 (which may be a PCB). Electrical connections may be provided as described further above.

A transparent body 110 is provided over the sensor 104 and at least some of the electronics 106. The transparent body 110 may be formed for example from a polymer such as resin or plastic (as described further above). One or more edges of the transparent body 110 may contact the substrate 108.

The transparent body 110 comprises a base portion 111 and a convex lens 112, the convex lens extending outwardly from the base portion and being located above the sensor 104. For brevity the convex lens 112 may be referred to as lens 112. In this embodiment the base portion 111 is not provided with a recess. The base portion 111 has a flat upper surface. An opaque material 124 is provided on the base portion 111 and surrounds the lens 112. As is explained further below, the opaque material 124 is delivered as a liquid onto the base portion 111. The liquid is delivered around the lens 112 such that the liquid is in contact with the lens. The liquid then solidifies, e.g. due to curing, and forms a solid opaque layer which surrounds the lens 112. This layer of opaque material 124 prevents light from passing through parts of the transparent body 110 which surround the lens 112 and then being incident upon the sensor 104. In other words, the opaque material 124 substantially prevents light from being incident upon the sensor 104 unless that light has passed through the lens 12. This advantageously improves the signal to noise ratio provided by the sensor 104. It may improve the performance of the sensor 104 in bright conditions and/or may improve the sensing range of the sensor.

The layer of opaque material 124 may be sufficiently thick that substantially no light passes through it. The layer of opaque material 124 may for example have a thickness of at least 1 micron, e.g. at least 10 microns.

The opaque liquid may be any curable opaque liquid, for example epoxy resin containing carbon black (or some other liquid containing carbon black). Any monomer which can be cured to form a polymer in a non-reversible manner may be used. The curing may for example be performed using ultraviolet radiation. An advantage of doing this is that the curing is achieved very quickly (e.g. in less than 10 seconds). An alternative method of curing uses heat, but this may take more time (e.g. typically an hour or more). Curing using heat could in some instances cause damage to the sensor or to the electronics of the sensor module. The opaque liquid may be referred to as curable ink.

A lower limit of the viscosity of the opaque liquid may be selected based upon a desire for the opaque liquid to have a sufficient thickness on the base 110 to block incident light. An upper limit of the viscosity of the opaque liquid may be selected based upon a desire for the opaque liquid to be wetting against the lens 112 (i.e. form a meniscus against the lens). If the opaque liquid is not wetting against the lens 112 then the opaque liquid will not form an aperture which is automatically aligned with the lens. The viscosity of the opaque liquid may for example be 3 Pas or more. The viscosity of the opaque liquid may for example be up to 500 Pas. The viscosity of the opaque liquid may for example be at least 100 Pas, and may for example be no more than 300 Pas (e.g. a value of around 200 Pas).

The opaque liquid may be delivered to the base 110 using an injection method. For example, the opaque liquid may be delivered from a nozzle which may form part of an inkjet head. In one arrangement the nozzle may have the form of a pipe which extends downwards from a head. In such an arrangement the head may be moved in a circle to allow the pipe to circumnavigate the lens 112. This may be done without rotating the head. In another example the nozzle may be provided at one end of a head (e.g. as depicted in FIG. 4). In such an example the head may be rotated as it circumnavigates the lens 112 such that the nozzle always points towards the lens 112.

The opaque liquid may be delivered to the base 110 adjacent to the lens 112. Where this is the case, the opaque liquid may naturally flow inwards to the lens 112 and form a meniscus 115 against the lens. Since the height of the meniscus is determined by surface tension of the opaque liquid, and not by where the liquid was delivered to the base 110, this may advantageously provide the opaque liquid with a generally consistent height around the lens 112 at the point where it meets the lens. This means that an aperture formed by the opaque material (once the liquid has been cured) has a desirable circular shape. The aperture is naturally formed by the inward flow of the liquid.

Although the opaque liquid (and opaque material 124 after curing) is in contact with the lens 112 most of the lens is left uncovered. That is, the opaque liquid covers only a minority portion of the lens 112. The opaque liquid may be said to be in contact with a bottom portion of the lens 112. The bottom portion of the lens may be considered to be a portion of the lens 112 which extends less than halfway up the lens, e.g. less than a quarter of the height of the lens.

A single inkjet head may be used to provide opaque liquid around a single lens 112. In an embodiment multiple inkjet heads may be used to provide opaque liquid around multiple lenses (for separate sensors) all held on the same substrate in parallel. This may increase production speed.

The opaque liquid may be any curable opaque liquid, for example epoxy resin containing carbon black (or some other liquid containing carbon black). Any monomer which can be cured to form a polymer in a non-reversible manner may be used. The curing may for example be performed using ultraviolet radiation. An advantage of doing this is that the curing is achieved very quickly (e.g. in less than 10 seconds). An alternative method of curing uses heat (for thermosetting liquid), but this may take more time (e.g. typically an hour or more). Curing using heat could in some instances cause damage to the sensor or to the electronics of the sensor module. The opaque liquid may be referred to as curable ink.

FIG. 6 depicts the entire sensor module 102 viewed from above. As with the first embodiment, the substrate 108 is generally rectangular in shape, and the transparent body 110 covers only part of it. Edges of the transparent body 110 do not reach the edge of the substrate 108. As a result there is a border 130 which extends around the perimeter of the transparent body 110 (as with the first embodiment).

A second transparent body 132 is located adjacent to the transparent body 110 (which may be referred to as the first transparent body 110). The second transparent body 132 may for example cover an emitter (not depicted) such as a vertical cavity surface emitting laser (VCSEL) or a light emitting diode (LED). Again, a border 134 of the substrate 108 extends around the second transparent body 132. The borders 130, 134 meet between the first transparent body 110 and the second transparent body 132 to form a combined border 133. As with the first embodiment, an opaque cover (not depicted) may be placed over the first and second transparent bodies 110, 132. The opaque cover may correspond with the opaque cover 40 depicted in FIGS. 3A and 3B.

Other features and advantages of the first embodiment may also apply to the second embodiment.

Embodiments of the invention have been described in connection with proximity sensors and ambient light sensors. However, embodiments of the invention may be used in connection with any optical sensor.

The sensor 4 may be a detector array, or may be a single detector (e.g. a photodiode). In one example the diameter of the lens 12 is around 600 microns, and a detector array is around 400×400 microns. In general, the diameter of the lens may be greater than a length of a detector array.

Any heat-curable or UV curable opaque liquid (which may be referred to as black ink) may be used as the opaque material 24. The liquid should be opaque at wavelengths of interest (i.e. wavelengths that are to be detected by the sensor 4). Wavelengths of interest may be near infrared (e.g. ~850-950 nm). The liquid may absorb infrared light or may reflect it.

An advantage of the invention is that is provides an improvement of the performance of the sensor whilst at the same time still allowing mass production of the sensor module in batches. That is, an array of covers 40 formed as a single piece may be fitted over an array of sensor modules 2 in a single operation (they may subsequently be diced to separate them). This is more efficient than individually fitting a cover onto each sensor module. Individual fitting of covers onto sensor modules would be required if the opening of the cover was precisely matched in size to the convex lens (the alternative way to improve performance of the sensor).

The sensor 4 may be configured to detect infrared light. Where this is the case, the opaque material 24 is opaque to infrared light. In general, the opaque material should be opaque for the wavelength or wavelengths which are detected by the sensor 4.

Although the depicted sensor module may include an emitter, in other embodiments the sensor module may be provided without an emitter (e.g. if the sensor module is for detecting ambient light).

In described embodiments of the invention the nozzle is moved relative to the sensor module. However, in other embodiments the sensor module may be moved relative to the nozzle. The same applies for multiple nozzles and sensor modules provided as an array.

The skilled person will understand that in the preceding description and appended claims, positional terms such as 'above', 'along', 'side', etc. are made with reference to conceptual illustrations, such as those shown in the appended drawings. These terms are used for ease of reference but are not intended to be of limiting nature. These terms are therefore to be understood as referring to an object when in an orientation as shown in the accompanying drawings.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in any embodiments, whether alone or in any appropriate combination with any other feature disclosed or illustrated herein.

The invention claimed is:

1. A sensor module comprising:

a sensor and a transparent body which is provided over the sensor;

a substrate which supports the transparent body; and a cover which is supported by the substrate, wherein the transparent body comprises a base portion and a convex lens which extends outwardly from the base portion and is located above the sensor, wherein the base portion comprises a top surface having a recess formed within the top surface and surrounds the convex lens and does not extend to an outer edge of the top surface and wherein the recess comprises an opaque material that surrounds the convex lens and wherein the cover including an opening through which the convex lens projects.

2. The sensor module of claim 1, wherein the opaque material is in contact with the convex lens.

3. The sensor module of claim 1, wherein the opaque material is in contact with a bottom portion of the convex lens.

4. The sensor module of claim 1, wherein the top surface has a substantially flat upper surface.

5. The sensor module of claim 1, wherein an inner edge of the recess corresponds with an outer edge of the convex lens.

6. The sensor module of claim 1, wherein the recess is generally circular.

7. The sensor module of claim 1, wherein the recess includes one or more outwardly extending arms.

8. The sensor module of claim 1, wherein the recess has a depth of at least 50 microns.

9. The sensor module of claim 1, wherein the opaque material is formed from a material that was liquid and that has been cured to become solid.

10. The sensor module of claim 1, wherein the opaque material is a polymer.

11. The sensor module of claim 10, wherein the polymer is opaque at near infrared wavelengths.

12. The sensor module of claim 10, wherein the polymer is curable using light.

13. The sensor module of claim 1, wherein the transparent body is transfer moulded or compression moulded.

14. The sensor module of claim 1, wherein the opaque material and the cover together substantially prevent light from being incident upon the sensor unless that light has passed through the convex lens.

* * * * *